(12) United States Patent
Hou et al.

(10) Patent No.: US 12,354,967 B2
(45) Date of Patent: Jul. 8, 2025

(54) CHIP PACKAGE ASSEMBLY, ELECTRONIC DEVICE, AND PREPARATION METHOD OF CHIP PACKAGE ASSEMBLY

(71) Applicant: HUAWEI TECHNOLOGIES CO., LTD., GuangDong (CN)

(72) Inventors: Zhaozheng Hou, Dongguan (CN); Xiaojing Liao, Shanghai (CN); Hao Peng, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 462 days.

(21) Appl. No.: 17/872,473

(22) Filed: Jul. 25, 2022

(65) Prior Publication Data
US 2023/0021432 A1    Jan. 26, 2023

(30) Foreign Application Priority Data
Jul. 26, 2021  (CN) .......................... 202110845274.0

(51) Int. Cl.
*H01L 23/538* (2006.01)
*H01L 21/48* (2006.01)
(Continued)

(52) U.S. Cl.
CPC ...... *H01L 23/5389* (2013.01); *H01L 21/4853* (2013.01); *H01L 21/4871* (2013.01);
(Continued)

(58) Field of Classification Search
CPC . H01L 23/5389; H01L 23/3677; H01L 23/13; H01L 23/145; H01L 23/36; H01L 23/3675; H01L 23/367; H01L 21/4853; H01L 21/4871; H01L 21/6835; H01L 23/3672; H01L 23/5386; H01L 23/552;
(Continued)

(56) References Cited

U.S. PATENT DOCUMENTS

| 2003/0117775 A1* | 6/2003 | Vrtis | ................. H01L 23/3737 257/713 |
| 2023/0037201 A1* | 2/2023 | Yen | ..................... H01L 23/3128 |

FOREIGN PATENT DOCUMENTS

| CN | 201623061 U | 11/2010 | |
| CN | 108807308 A | 11/2018 | |
| JP | 2004128042 | * 4/2022 | ... H01L 2224/48091 |

\* cited by examiner

*Primary Examiner* — Marlon T Fletcher
*Assistant Examiner* — Christina A Sylvia
(74) *Attorney, Agent, or Firm* — Rimon PC

(57) ABSTRACT

This application discloses a chip package assembly, an electronic device, and a preparation method of a chip package assembly. The chip package assembly includes a package substrate, a chip, and a heat dissipation part. The package substrate includes an upper conductive layer, a lower conductive layer, and a conductive part connected between the upper conductive layer and the lower conductive layer. The chip includes a front electrode and a back electrode that are disposed opposite each other, the chip is embedded in the package substrate, the conductive part surrounds the chip, the front electrode is connected to the lower conductive layer, and the back electrode is connected to the upper conductive layer. The heat dissipation part is connected to a surface of the upper conductive layer that is away from the chip. The upper conductive layer, the lower conductive layer, and the conductive part each conduct heat.

17 Claims, 9 Drawing Sheets

(51) Int. Cl.
*H01L 21/683* (2006.01)
*H01L 23/00* (2006.01)
*H01L 23/367* (2006.01)
*H01L 23/552* (2006.01)

(52) U.S. Cl.
CPC ...... *H01L 21/6835* (2013.01); *H01L 23/3672* (2013.01); *H01L 23/5386* (2013.01); *H01L 23/552* (2013.01); *H01L 23/562* (2013.01); *H01L 23/564* (2013.01); *H01L 24/19* (2013.01); *H01L 24/20* (2013.01); *H01L 2221/68372* (2013.01); *H01L 2224/214* (2013.01); *H01L 2924/3025* (2013.01); *H01L 2924/351* (2013.01)

(58) Field of Classification Search
CPC ... H01L 23/562; H01L 23/564; H01L 23/486; H01L 23/52; H01L 24/19; H01L 24/20; H01L 2221/68372; H01L 2224/214; H01L 2924/3025; H01L 2924/351; H01L 25/0655; H01L 25/50
See application file for complete search history.

CHIP PACKAGE ASSEMBLY, ELECTRONIC DEVICE, AND PREPARATION METHOD OF CHIP PACKAGE ASSEMBLY

CROSS-REFERENCE TO RELATED APPLICATION

This application claims priority to Chinese Patent Application No. 202110845274.0, filed on Jul. 26, 2021, which is hereby incorporated by reference in its entirety.

TECHNICAL FIELD

Embodiments of this application relate to the field of chip technologies, and in particular, to a chip package assembly, an electronic device, and a preparation method of a chip package assembly.

BACKGROUND

As electronic devices continuously become more lightweight, compact, and miniaturized, and the degree of chip package assembly integration into the electronic devices becomes increasingly high, high-density integrated embedded packages in which a chip is embedded into a substrate or a package body have gradually emerged in the industry. However, there is a relatively serious heat dissipation problem in the foregoing chip package assemblies, and the heat generated by the chip cannot be effectively dissipated. Consequently, a safety hazard is caused.

SUMMARY

An objective of this application is to provide a chip package assembly, an electronic device, and a preparation method of a chip package assembly, so that effective heat dissipation can be performed on a chip in the chip package assembly, to effectively reduce the safety hazard.

To implement the objective of this application, the following technical solutions are provided:

According to a first aspect, this application provides a chip package assembly. The chip package assembly includes a package substrate, a chip, and a heat dissipation part. The package substrate includes an upper conductive layer, a lower conductive layer, and a conductive part connected between the upper conductive layer and the lower conductive layer. The chip includes a front electrode and a back electrode that are disposed opposite to each other, the chip is embedded in the package substrate, the conductive part surrounds the chip, the front electrode is connected to the lower conductive layer, and the back electrode is connected to the upper conductive layer. The heat dissipation part is connected to a surface of the upper conductive layer that is away from the chip. The upper conductive layer, the lower conductive layer, and the conductive part each are characterized by a coefficient of thermal conductivity. It can be understood that the conductive part, the lower conductive layer, and the upper conductive layer each have a coefficient of thermal conductivity sufficient to effectively conduct heat generated by the chip, thereby implementing a heat dissipation function. In addition, the conductive part, the lower conductive layer, and the upper conductive layer jointly surround the chip, to implement a corresponding chip package function. In other words, the conductive part, the upper conductive layer, and the lower conductive layer are connected to each other, and encloses an accommodation cavity. The accommodation cavity is configured to accommodate the chip. The chip includes the front electrode and the back electrode that are disposed opposite to each other, the chip is embedded in the package substrate, the front electrode is connected to the lower conductive layer, and the back electrode is connected to the upper conductive layer. It can be understood that the chip generates a large amount of heat while working. The generated heat not only can be conducted to the lower conductive layer through the front electrode for heat dissipation, but also can be conducted to the upper conductive layer through the back electrode for heat dissipation, thereby implementing a bidirectional heat dissipation function. In this way, the chip package assembly achieves a relatively good heat dissipation effect. The heat dissipation part is connected to the surface of the upper conductive layer that is away from the chip. It can be understood that compared with the upper conductive layer, the heat dissipation part has a larger heat exchange surface area, and therefore has a relatively strong heat dissipation function. The heat generated by the chip may be conducted to the heat dissipation part through the upper conductive layer, to achieve a relatively good heat dissipation effect. It can be further understood that, because the conductive part is separately connected to the upper conductive layer and the lower conductive layer, a part of the heat conducted to the lower conductive layer may also be conducted to the heat dissipation part through the conductive part and the upper conductive layer, to further improve the heat dissipation effect.

According to the chip package assembly provided in this application, the chip is connected to the upper conductive layer and the lower conductive layer of the package substrate, so that the heat generated by the chip can be bidirectionally conducted for heat dissipation. Further, the heat dissipation part is disposed on the upper conductive layer, so that the chip package assembly can achieve a better heat dissipation effect.

In an implementation, the front electrode is in contact with the upper conductive layer. When the front electrode of the chip is in direct contact with the upper conductive layer, a corresponding circuit transmission function can be effectively met. In addition, the heat generated by the chip while working can be effectively conducted to the upper conductive layer through the front electrode for heat dissipation. Similarly, the back electrode of the chip may also be in contact with the lower conductive layer, so that the heat generated by the chip can be effectively conducted to the lower conductive layer through the back electrode for bidirectional heat dissipation.

In an implementation, the heat dissipation part includes a plurality of heat dissipation protuberances, the plurality of heat dissipation protuberances each are connected to the upper conductive layer, and the plurality of heat dissipation protuberances are spaced from each other. It can be understood that the heat dissipation part may be a fin structure, and the plurality of heat dissipation protuberances spaced from each other are disposed to effectively increase a heat exchange surface area, so that the heat dissipation part has a relatively good heat dissipation effect, thereby avoiding a safety hazard caused by poor heat dissipation of the chip package assembly. It should be noted that a structure of the heat dissipation part includes but is not limited to the fin structure, and may be any other structure having a relatively good heat dissipation function. The structure of the heat dissipation part is not specifically limited herein.

In an implementation, an extension direction of each heat dissipation protuberance and an extension direction of the upper conductive layer are arranged at an included angle. It can be understood that in the foregoing structure, there is enough heat dissipation space between the heat dissipation protuberance and the upper conductive layer, to achieve a relatively good heat dissipation effect.

In an implementation, all the heat dissipation protuberances have a same extension direction. It can be understood that in the foregoing structure, an overall structure of the heat dissipation part is neat and simple. This ensures a corresponding heat dissipation effect, effectively simplifies a production process, and improves process production efficiency.

In an implementation, an extension direction of some heat dissipation protuberances is a first direction, an extension direction of some heat dissipation protuberances is a second direction, and the first direction is different from the second direction. It can be understood that in some cases, a refrigeration part may be further disposed on a periphery of the chip package assembly. For example, a corresponding water cooling part or air cooling part is disposed in each of the first direction and the second direction of the heat dissipation part. In this case, some heat dissipation protuberances may be disposed to extend along the first direction, and some heat dissipation protuberances may be disposed to extend along the second direction, so that the heat dissipation protuberances are close to the refrigeration part to achieve a relatively good heat dissipation effect.

In an implementation, the heat dissipation protuberance is flat plate-shaped or columnar. It can be understood that based on an actual production requirement, the heat dissipation protuberance may be designed to be flat plate-shaped or columnar. A production process of the heat dissipation protuberance in the foregoing shape is simple, and can effectively meet a corresponding heat dissipation function.

In an implementation, the heat dissipation part and the upper conductive layer are an integrated structure. It can be understood that when the heat dissipation part and the upper conductive layer are separate structures, the heat dissipation part needs to be fixedly connected to the upper conductive layer by using a corresponding fastener. Consequently, additional thermal resistance is caused when the heat dissipation part is mounted on the upper conductive layer, and heat dissipation performance of the chip package assembly is affected. The heat dissipation part and the upper conductive layer are designed as an integrated structure, so that additional thermal resistance can be effectively eliminated, to achieve a relatively good heat dissipation effect. In addition, steps of mounting onto the substrate can be further reduced, thereby effectively improving production efficiency of the chip package assembly. It should be noted that the heat dissipation part and the upper conductive layer may alternatively be integrally formed by electroplating or in another manner. A manner of forming the integrated structure is not specifically limited herein.

In an implementation, the conductive part, the upper conductive layer, and the lower conductive layer each are a metal material. It can be understood that because the conductive part, the upper conductive layer, and the lower conductive layer surround the chip, when they are prepared by using metal materials, the package substrate formed by them may be considered as a metal shielding can, which can effectively block an electromagnetic field between the chip and an external environment, thereby effectively improving an anti-interference capability of the chip package assembly to achieve a relatively good electromagnetic shielding effect. It can be further understood that, in this embodiment of this application, the package substrate is prepared by using a metal material, has relatively good moisture-proof performance, and can effectively prevent moisture intrusion, thereby prolonging a service life of the chip package assembly in a humid environment. In addition, the package substrate has relatively high structural strength. In this way, the chip package assembly is not prone to deformation in use, thereby effectively avoiding structural damage caused by stresses acting on the chip.

In an implementation, the conductive part, the upper conductive layer, the lower conductive layer, and the heat dissipation part each are prepared by using copper. It can be understood that copper has relatively good electrical conduction performance and heat conduction performance. When the conductive part, the upper conductive layer, the lower conductive layer, and the heat dissipation part are prepared by using copper materials, the chip package assembly formed by the foregoing several parts can meet both a corresponding circuit transmission function and a heat conduction function, so that the chip package assembly can work normally while achieving a relatively good heat dissipation effect.

In an implementation, the chip package assembly further includes an insulator, and the insulator is disposed between the chip and the conductive part to isolate the chip from the conductive part. It can be understood that the conductive part usually further conducts electricity. When the chip is in direct contact with the conductive part, a short circuit or another circuit problem is prone to occur, causing a failure of the chip package assembly. Therefore, the insulator is disposed between the chip and the conductive part, to implement effective isolation between the chip and the conductive part, thereby effectively ensuring a normal function of the chip package assembly. It can be further understood that, usually, a volume of the accommodation cavity is greater than a volume of the chip, and the insulator is filled in a gap between the chip and the conductive part, to effectively secure the chip, thereby improving structural stability of the chip package assembly. The insulator is prepared by using a material including but not limited to a resin material, and may alternatively be prepared by using any other material having an insulation property, provided that a corresponding insulation function can be met. This is not specifically limited herein.

In an implementation, the package substrate further includes at least one separation part, the separation part is connected to the conductive part and is surrounded by the conductive part, the separation part and the conductive part together surround a plurality of chips, and every two adjacent chips are isolated by the separation part. In other words, the separation part is accommodated in the accommodation cavity and is connected to the conductive part, to divide the accommodation cavity into a plurality of accommodation sub-cavities. There are a plurality of chips, and each accommodation sub-cavity accommodates one chip. The at least one separation part is disposed to form the plurality of accommodation sub-cavities, so that the package substrate can package a plurality of chips, and the chip package assembly can effectively meet working requirements of the plurality of chips. It should be noted that the chip in each accommodation sub-cavity is connected to both the upper conductive layer and the lower conductive layer, so that bidirectional conduction and heat dissipation can be implemented on each chip, to achieve a relatively good heat dissipation effect. In addition, the conductive part, the separation part, the upper conductive layer, and the lower conductive layer package the plurality of chips separately, so that moisture-proof processing and electromagnetic shielding processing can be performed on each chip.

In an implementation, the insulator is disposed between the chip and the conductive part, and between the chip and the separation part, to isolate the chip from the conductive part and isolate the chip from the separation part. In other words, the insulator is disposed in each accommodation sub-cavity, and the insulator is disposed between the chip and the conductive part and between the chip and the separation part, to isolate the chip from the conductive part and isolate the chip from the separation part. The insulator is disposed in each accommodation sub-cavity, so that each chip is isolated from the conductive part and the separation part. This effectively avoids a short circuit or another circuit problem to ensure a normal function of the chip package assembly. In addition, a plurality of insulators exist, and therefore can limit and secure all the plurality of chips, thereby effectively preventing deviation of the chips in the package substrate.

In an implementation, the at least one separation part includes a first separation part and a second separation part, the first separation part extends along a third direction, and the second separation part extends along a fourth direction; and both the third direction and the fourth direction are perpendicular to a thickness direction of the chip package assembly, and the third direction and the fourth direction are arranged at an included angle. It should be noted that there may be a plurality of separation parts and a plurality of relative location relationships between the plurality of separation parts. A quantity of separation parts and relative location relationships thereof are determined based on an actual production requirement, and are not specifically limited herein.

In an implementation, the first separation part includes a first sub-spacer and a second sub-spacer that are spaced from each other, and both the first sub-spacer and the second sub-spacer extend along the third direction; and the second separation part includes a third sub-spacer and a fourth sub-spacer that are spaced from each other, and both the third sub-spacer and the fourth sub-spacer extend along the fourth direction. A plurality of sub-spacers are disposed side by side to form one separation part, so that structural strength of the separation part is greatly improved, thereby effectively improving overall structural stability of the chip package assembly.

In an implementation, the conductive part, the upper conductive layer, and the lower conductive layer together form an integrated structure. The conductive part, the upper conductive layer, and the lower conductive layer may be integrally formed by electroplating, and they together form the package substrate. When the package substrate is an integrated structure, the structure of the package substrate is relatively stable, thereby effectively improving overall structural stability of the chip package assembly. It should be noted that the conductive part, the upper conductive layer, and the lower conductive layer may alternatively form the integrated structure in another manner. A manner of forming the integrated structure is not specifically limited herein.

According to a second aspect, this application provides an electronic device. The electronic device includes a main board and the chip package assembly according to any implementation of the first aspect. The main board includes a board body and a line structure disposed on a surface of the board body. The chip package assembly is disposed on a side of the line structure that is away from the board body. A connector is further disposed between the main board and the chip package assembly. The connector is connected to the lower conductive layer and the line structure, so that the chip package assembly is electrically connected to the main board.

According to the electronic device provided in this application, the chip package assembly is electrically connected to the main board to meet a corresponding circuit transmission function. In addition, because the chip package assembly provided in this application is used in the electronic device provided in this application, the electronic device also has relatively good heat dissipation performance, moisture-proof performance, and electromagnetic shielding performance, and has relatively strong structural stability. This can effectively avoid structural damage caused by stress action on a chip.

In an implementation, a package substrate in the chip package assembly, the main board, and the connector together surround a chip, so that the chip is isolated from the outside. In the foregoing structure, the package substrate, the main board, and the connector together form a complete moisture-proof barrier, to effectively block moisture intrusion, thereby achieving a relatively good moisture-proof effect. It should be noted that there may be a plurality of types of connectors, provided that corresponding electrical conduction and moisture-proof functions can be met. For example, the connector may be solder paste, that is, the lower conductive layer and the line structure are connected by soldering, to implement an electrical connection between the main board and the chip package assembly.

According to a third aspect, this application provides a preparation method of a chip package assembly, used to prepare the chip package assembly according to the first aspect. The preparation method includes: providing a substrate; forming a conductive part and a limiting part on the substrate, where the conductive part surrounds the limiting part and is spaced from the limiting part, the conductive part encloses an accommodation cavity, a first space is formed between the conductive part and the limiting part, and the limiting part forms a second enclosed space; disposing an insulation structure in each of the first space and the second space; removing the substrate, the limiting part, and the insulation structure located in the second space, retaining the insulation structure located in the first space to form an insulator, and retaining the conductive part; placing a chip in a space surrounded by the insulator; forming an upper conductive layer on one side of the chip and the conductive part, and forming a lower conductive layer on an opposite side; and forming a heat dissipation part on a surface of the upper conductive layer that is away from the chip, and processing the lower conductive layer to form a corresponding line layer.

According to the preparation method of the chip package assembly provided in this application, the chip package assembly provided in this application can be prepared. In addition, the chip package assembly has relatively good heat dissipation performance, moisture-proof performance, and electromagnetic shielding performance, and has relatively strong structural stability. This can effectively avoid structural damage caused by stress action on the chip.

In an implementation, the "forming a conductive part and a limiting part on the substrate" includes: covering a partial location on a surface of the substrate with a first dry film; forming the conductive part and the limiting part by electroplating at locations not covered with the first dry film; and removing the first dry film. It can be understood that by dividing regions on the surface of the substrate, a location at which the conductive part and the limiting part do not need to be formed is covered with the first dry film, and the first dry film can prevent contact between electroplated metal and the substrate. The locations at which the conductive part and the limiting part need to be formed are not covered with the first dry film, to expose the substrate at the locations, so that the conductive part and the limiting part are formed by electroplating on the surface of the substrate at the locations.

In an implementation, the "disposing an insulation structure in each of the first space and the second space" includes: filling an insulating material in the first space and the second space, and performing a press-fit process to form the insulation structures; and planarizing the conductive part and the limiting part, so that heights of the insulation structures, the conductive part, and the limiting part are the same in a thickness direction of the substrate. The insulating material includes but is not limited to a resin material, or may alternatively be any other material having an insulation property. This is not specifically limited herein. It can be understood that the planarization enables the insulation structures, the conductive part, and the limiting part to have a same height. In this way, when the upper conductive layer is subsequently formed, a surface to which the upper conductive layer is attached is flatter. This facilitates processing and forming of the upper conductive layer.

In an implementation, the "removing the substrate, the limiting part, and the insulation structure located in the second space" includes: etching the substrate to remove the substrate; covering a surface of the conductive part with a second dry film; etching the limiting part not covered with the second dry film, to remove the limiting part and the insulation structure located in the second space; and removing the second dry film. It can be understood that the substrate does not exist in a finished product, and is an intermediate structure in a preparation process. Therefore, the substrate may be first removed in an etching manner. It can be further understood that, the limiting part does not exist in the finished product, either, and is configured to form the first space together with the conductive part, so as to form the insulator. Therefore, the limiting part also needs to be removed. The second dry film is configured to block erosion from a chemical agent. After the substrate is etched and removed, the surface of the conductive part is covered with the second dry film, so that the conductive part can be effectively prevented from being etched, and the conductive part is retained. It can be further understood that, the limiting part not protected by a dry film may also be removed through etching by using a chemical agent. In addition, the insulation structure located in the second space is also removed because the insulation structure is not secured by the limiting part and the substrate. The retained insulation structure located in the first space forms the insulator, to secure the chip and isolate the chip from the conductive part.

In an implementation, in a process of the "forming a conductive part and a limiting part on the substrate", the method further includes: further forming at least one separation part on the substrate, where the separation part is connected to the conductive part, the separation part divides the accommodation cavity into a plurality of accommodation sub-cavities, the limiting part is disposed in the accommodation sub-cavity and is spaced from the conductive part and the separation part, the first space is formed among the limiting part, the conductive part, and the separation part, and the limiting part forms the second enclosed space. It can be further understood that, when the prepared chip package assembly needs to package a plurality of chips, the separation part needs to be further disposed. Correspondingly, steps of the preparation method provided in this application are changed accordingly.

DESCRIPTION OF EMBODIMENTS

The following describes embodiments of this application with reference to the accompanying drawings in embodiments of this application.

Figure 1A:
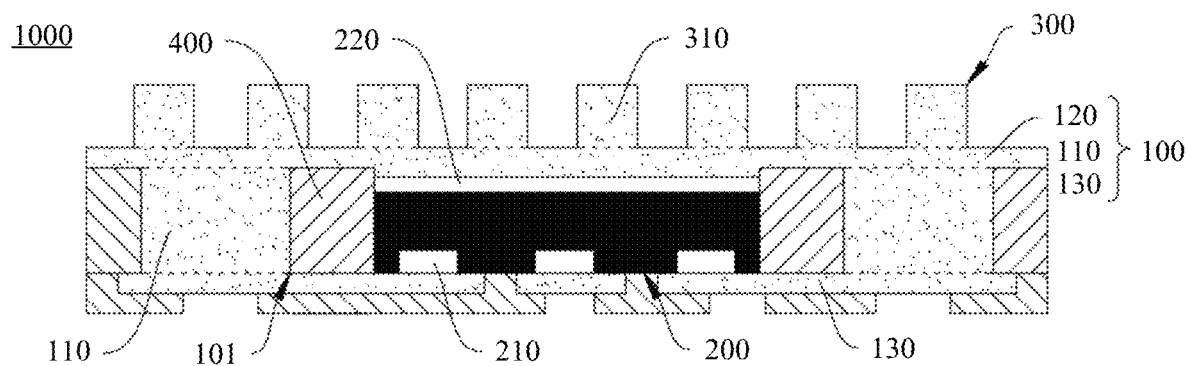
FIG. 1a is a schematic diagram of a structure of a chip package assembly according to an exemplary embodiment of this application.

First, referring to FIG. 1a, an embodiment of this application provides a chip package assembly 1000. The chip package assembly 1000 includes a package substrate 100, a chip 200, and a heat dissipation part 300.

The package substrate 100 includes an upper conductive layer 120, a lower conductive layer 130, and a conductive part 110 connected between the upper conductive layer 120 and the lower conductive layer 130. The package substrate 100 formed by the upper conductive layer 120, the lower conductive layer 130, and the conductive part 110 is configured to accommodate the chip 200. In other words, the conductive part 110, the upper conductive layer 120, and the lower conductive layer 130 are connected to each other, and enclose an accommodation cavity 101. The accommodation cavity 101 is configured to accommodate the chip 200. The lower conductive layer 130 is usually processed into a line layer, to implement a corresponding circuit transmission function. The upper conductive layer 120 may be processed into a line layer, or may be a complete plate-shaped structure. This is not specifically limited herein. It can be understood that the upper conductive layer 120, the lower conductive layer 130, and the conductive part 110 each are characterized by a coefficient of thermal conductivity sufficient to effectively conduct heat generated by the chip 200, thereby implementing a heat dissipation function.

The chip 200 includes a front electrode 210 and a back electrode 220 that are disposed opposite to each other. The chip 200 is embedded in the package substrate 100, and the conductive part 110 surrounds the chip 200. In other words, the chip 200 is accommodated in the accommodation cavity 101. The front electrode 210 of the chip 200 is connected to the lower conductive layer 130, and the back electrode 220 thereof is connected to the upper conductive layer 120. It can be understood that the chip 200 generates a large amount of heat while working. The generated heat not only can be conducted to the lower conductive layer 130 through the front electrode 210 for heat dissipation, but also can be conducted to the upper conductive layer 120 through the back electrode 220 for heat dissipation, thereby implementing a bidirectional heat dissipation function. In this way, the chip package assembly 1000 achieves a relatively good heat dissipation effect.

The heat dissipation part 300 is connected to a surface of the upper conductive layer 120 that is away from the chip 200. It can be understood that compared with the upper conductive layer 120, the heat dissipation part 300 has a larger heat exchange surface area, and therefore has a relatively strong heat dissipation function. The heat generated by the chip 200 may be conducted to the heat dissipation part 300 through the upper conductive layer 120, to achieve a relatively good heat dissipation effect. It can be further understood that, because the conductive part 110 is separately connected to the upper conductive layer 120 and the lower conductive layer 130, a part of the heat conducted to the lower conductive layer 130 may also be conducted to the heat dissipation part 300 through the conductive part 110 and the upper conductive layer 120, to further improve a heat dissipation effect.

According to the chip package assembly 1000 provided in this embodiment of this application, the chip 200 is connected to the upper conductive layer 120 and the lower conductive layer 130 of the package substrate 100, so that the heat generated by the chip 200 can be bidirectionally conducted for heat dissipation. Further, the heat dissipation part 300 is disposed on the upper conductive layer 120, so that the chip package assembly 1000 can achieve a better heat dissipation effect.

In a possible embodiment, the front electrode 210 is in contact with the upper conductive layer 120. It can be understood that when the front electrode 210 of the chip 200 is in direct contact with the upper conductive layer 120, a corresponding circuit transmission function can be effectively met. In addition, the heat generated by the chip 200 while working can be effectively conducted to the upper conductive layer 120 through the front electrode 210 for heat dissipation. Similarly, the back electrode 220 of the chip 200 may also be in contact with the lower conductive layer 130, so that the heat generated by the chip can be effectively conducted to the lower conductive layer 130 through the back electrode 220 for bidirectional heat dissipation.

In a possible embodiment, the conductive part 110, the upper conductive layer 120, and the lower conductive layer 130 each are a metal material. It can be understood that because the conductive part 110, the upper conductive layer 120, and the lower conductive layer 130 surround the chip 200, when they are prepared by using metal materials, the package substrate 100 formed by them may be considered as a metal shielding can, which can effectively block an electromagnetic field between the chip 200 and an external environment, thereby effectively improving an anti-interference capability of the chip package assembly 1000 to achieve a relatively good electromagnetic shielding effect. It can be further understood that, in this embodiment of this application, the package substrate 100 is prepared by using a metal material, has relatively good moisture-proof performance, and can effectively prevent moisture intrusion, thereby prolonging a service life of the chip package assembly 1000 in a humid environment. In addition, the package substrate 100 has relatively high structural strength. In this way, the chip package assembly 1000 is not prone to deformation in use, thereby effectively avoiding structural damage caused by stress action on the chip 200.

The conductive part 110, the upper conductive layer 120, and the lower conductive layer 130 together form an integrated structure. It can be understood that the conductive part 110, the upper conductive layer 120, and the lower conductive layer 130 may be integrally formed by electroplating, and they together form the package substrate 100. When the package substrate 100 is an integrated structure, the structure of the package substrate 100 is relatively stable, thereby effectively improving overall structural stability of the chip package assembly 1000. It should be noted that the conductive part 110, the upper conductive layer 120, and the lower conductive layer 130 may alternatively form the integrated structure in another manner. A manner of forming the integrated structure is not specifically limited herein.

In a possible embodiment, the heat dissipation part 300 and the upper conductive layer 120 form an integrated structure. It can be understood that when the heat dissipation part 300 and the upper conductive layer 120 are separate structures, the heat dissipation part 300 needs to be fixedly connected to the package substrate 100 by using a corresponding fastener. Consequently, additional thermal resistance is caused when the heat dissipation part 300 is mounted on the upper conductive layer 120, and heat dissipation performance of the chip package assembly 1000 is affected. In this embodiment, the heat dissipation part 300 and the upper conductive layer 120 are designed as an integrated structure, so that additional thermal resistance can be effectively eliminated, to achieve a relatively good heat dissipation effect. In addition, steps of mounting onto the substrate can be further reduced, thereby effectively improving production efficiency of the chip package assembly 1000. It should be noted that the heat dissipation part 300 and the upper conductive layer 120 may alternatively be integrally formed by electroplating or in another manner. A manner of forming the integrated structure is not specifically limited herein.

In a possible embodiment, the heat dissipation part 300 includes a plurality of heat dissipation protuberances 310. The plurality of heat dissipation protuberances 310 each are connected to the upper conductive layer 120, and the plurality of heat dissipation protuberances 310 are spaced from each other. It can be understood that in this embodiment, the heat dissipation part 300 is a fin structure, and the plurality of heat dissipation protuberances 310 spaced from each other are disposed to effectively increase a heat exchange surface area, so that the heat dissipation part 300 has a relatively good heat dissipation effect, thereby avoiding a safety hazard caused by poor heat dissipation of the chip package assembly 1000. It should be noted that a structure of the heat dissipation part 300 includes but is not limited to the fin structure, and may be any other structure having a relatively good heat dissipation function. The structure of the heat dissipation part 300 is not specifically limited herein.

As shown in FIG. 1*a*, in a possible embodiment, an extension direction of each heat dissipation protuberance 310 and an extension direction of the upper conductive layer 120 are arranged at an included angle. It can be understood that in the foregoing structure, there is enough heat dissipation space between the heat dissipation protuberance 310 and the upper conductive layer 120, to achieve a relatively good heat dissipation effect.

Figure 1B:
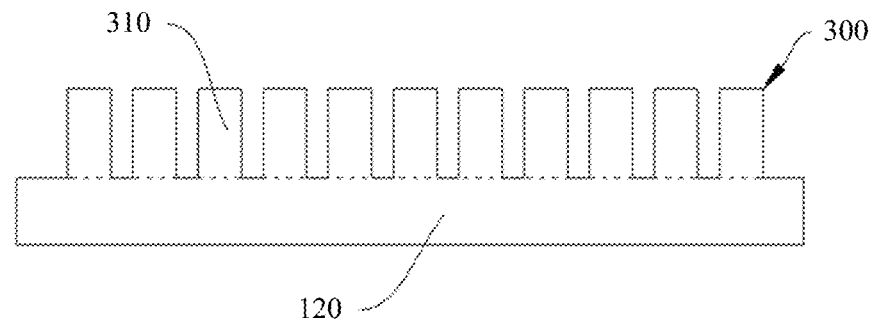
FIG. 1b is a schematic diagram of an arrangement of heat dissipation protuberances and an upper conductive layer in an exemplary embodiment.
Figure 1C:
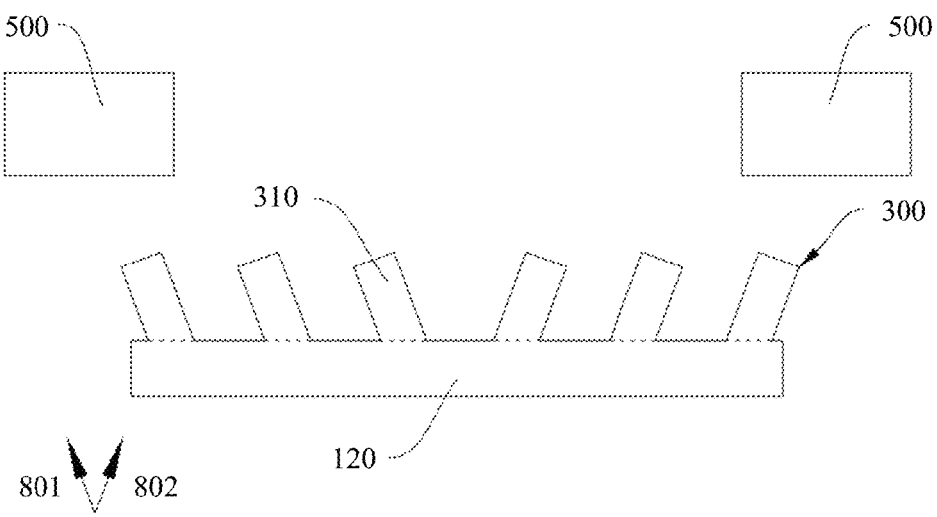
FIG. 1c is a schematic diagram of an arrangement of heat dissipation protuberances and an upper conductive layer in another exemplary embodiment.

Refer to both FIG. 1*b* and FIG. 1*c*. As shown in FIG. 1*b*, in a possible embodiment, all the heat dissipation protuberances 310 have a same extension direction. It can be understood that in the foregoing structure, an overall structure of the heat dissipation part 300 is neat and simple. This ensures a corresponding heat dissipation effect, effectively simplifies a production process, and improves process production efficiency.

As shown in FIG. 1*c*, in a possible embodiment, an extension direction of some heat dissipation protuberances 310 is a first direction 801, an extension direction of some heat dissipation protuberances 310 is a second direction 802, and the first direction 801 is different from the second direction 802. It can be understood that in some cases, a refrigeration part 500 may be further disposed on a periphery of the chip package assembly 1000. For example, a corresponding water cooling part or air cooling part is disposed in each of the first direction 801 and the second direction 802 of the heat dissipation part 300. In this case, some heat dissipation protuberances 310 may be disposed to extend along the first direction 801, and some heat dissipation protuberances 310 may be disposed to extend along the second direction 802, so that the heat dissipation protuberances 310 are close to the refrigeration part 500 to achieve a relatively good heat dissipation effect.

Figure 1D:
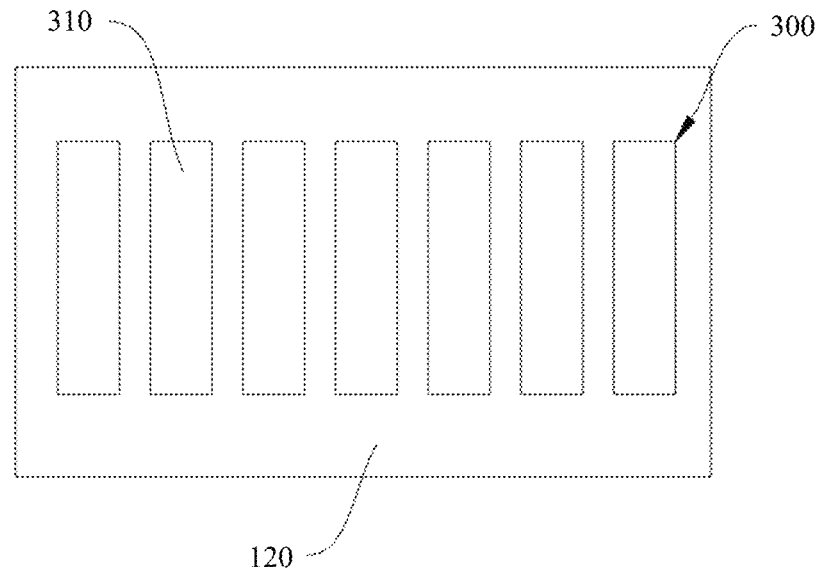
FIG. 1d is a schematic diagram of a top-view structure of heat dissipation protuberances and an upper conductive layer in an exemplary embodiment.
Figure 1E:
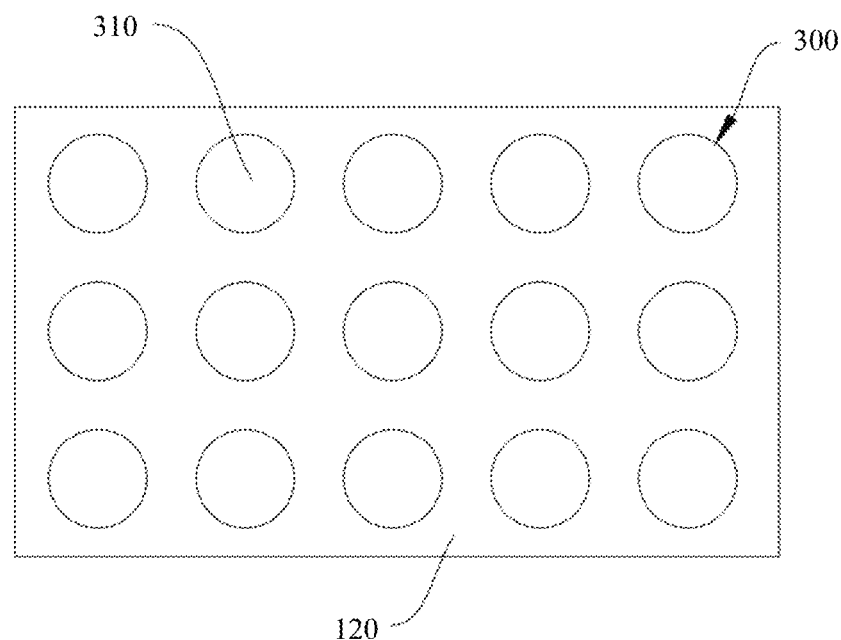
FIG. 1e is a schematic diagram of a top-view structure of heat dissipation protuberances and an upper conductive layer in another exemplary embodiment.

Refer to both FIG. 1*d* and FIG. 1*e*. It can be understood that the heat dissipation protuberances 310 may have a plurality of shapes, provided that a heat dissipation function is available. As shown in FIG. 1*d*, in a possible embodiment, the heat dissipation protuberance 310 is flat plate-shaped. As shown in FIG. 1*e*, in another possible embodiment, the heat dissipation protuberance 310 is columnar. It should be noted that structures of the heat dissipation protuberances 310 in the foregoing two shapes are simple. This can effectively reduce processing costs, and can also meet a corresponding heat dissipation function.

In a possible embodiment, materials of the conductive part 110, the upper conductive layer 120, the lower conductive layer 130, and the heat dissipation part 300 are all copper. It can be understood that copper has relatively good electrical conduction performance and heat conduction performance. When the conductive part 110, the upper conductive layer 120, the lower conductive layer 130, and the heat dissipation part 300 are prepared by using copper materials, the chip package assembly 1000 formed by the foregoing several parts can meet both a corresponding circuit transmission function and a heat conduction function, so that the chip package assembly 1000 can work normally while achieving a relatively good heat dissipation effect.

In a possible embodiment, the chip package assembly 1000 further includes an insulator 400, and the insulator 400 is disposed between the chip 200 and the conductive part 110 to isolate the chip 200 from the conductive part 110. It can be understood that the conductive part 110 usually further conducts electricity. When the chip 200 is in direct contact with the conductive part 110, a short circuit or another circuit problem is prone to occur, causing a failure of the chip package assembly 1000. Therefore, the insulator 400 is disposed between the chip 200 and the conductive part 110, to implement effective isolation between the chip 200 and the conductive part 110, thereby effectively ensuring a normal function of the chip package assembly 1000. It can be further understood that, usually, a volume of the accommodation cavity 101 is greater than a volume of the chip 200, and the insulator 400 is filled in a gap between the chip 200 and the conductive part 110, to effectively secure the chip 200, thereby improving structural stability of the chip package assembly 1000. In a specific embodiment, the insulator 400 is prepared by using a resin material, to implement a corresponding insulation function. It should be noted that the insulator 400 may alternatively be prepared by using any other material having an insulation property. This is not specifically limited herein.

Figure 2:
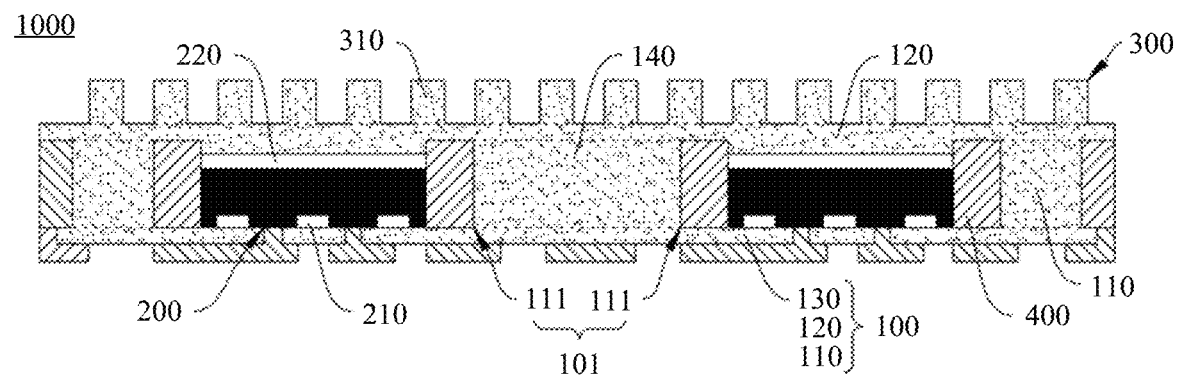
FIG. 2 is a schematic diagram of a structure of a chip package assembly according to an exemplary embodiment.
Figure 3:
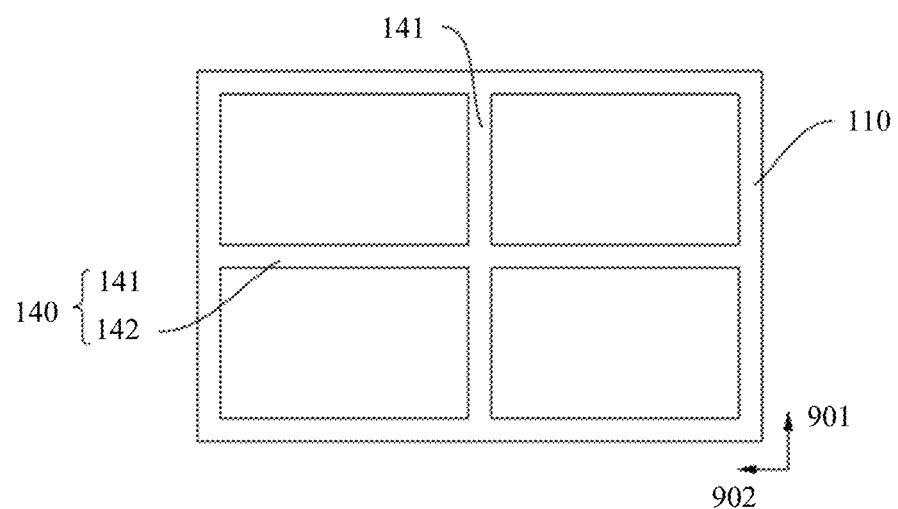
FIG. 3 is a schematic diagram of a top view of a conductive part and a separation part in the chip package assembly shown in FIG. 2.

Refer to both FIG. 2 and FIG. 3. As shown in FIG. 2, in a possible embodiment, the package substrate 100 further includes at least one separation part 140. The separation part 140 is connected to the conductive part 110 and is surrounded by the conductive part 110. The separation part 400 and the conductive part 110 together surround a plurality of chips 200, and every two adjacent chips 200 are isolated by the separation part. In other words, the separation part 140 is accommodated in the accommodation cavity 101 and is connected to the conductive part 110, to divide the accommodation cavity 101 into a plurality of accommodation sub-cavities 111. There are a plurality of chips 200, and each accommodation sub-cavity 111 accommodates one chip 200. It can be understood that the at least one separation part 140 is disposed to form the plurality of accommodation sub-cavities 111, so that the package substrate 100 can package a plurality of chips 200, and the chip package assembly 1000 provided in this embodiment can effectively meet working requirements of the plurality of chips 200. It should be noted that the chip 200 in each accommodation sub-cavity 111 is connected to the upper conductive layer 120 and the lower conductive layer 130, so that bidirectional conduction and heat dissipation can be implemented on each chip 200, to achieve a relatively good heat dissipation effect. In addition, the conductive part 110, the separation part 140, the upper conductive layer 120, and the lower conductive layer 130 package the plurality of chips 200 separately, so that moisture-proof processing and electromagnetic shielding processing can be performed on each chip 200.

As shown in FIG. 3, in a specific embodiment, the at least one separation part 140 includes a first separation part 141 and a second separation part 142. The first separation part 141 extends along a third direction 901, and the second separation part 142 extends along a fourth direction 902. Both the third direction 901 and the fourth direction 902 are perpendicular to a thickness direction of the chip package assembly 1000, and the third direction 901 and the fourth direction 902 are arranged at an included angle. The first separation part 141 and the second separation part 142 divide the accommodation cavity 101 into four accommodation sub-cavities 111, and one chip 200 is disposed in each accommodation sub-cavity 111, so that the chip package assembly 1000 provided in this embodiment accommodates four chips 200. It should be noted that there may be a plurality of separation parts 140 and a plurality of relative location relationships between the plurality of separation parts 140. A quantity of separation parts 140 and relative location relationships thereof are determined based on an actual production requirement, and are not specifically limited herein.

In a possible embodiment, the insulator 400 is disposed between the chip 200 and the conductive part 110, and between the chip 200 and the separation part 140, to isolate the chip 200 from the conductive part 110 and isolate the chip 200 from the separation part 140. In other words, the insulator 400 is disposed in each accommodation sub-cavity 111, and the insulator 400 is disposed between the chip 200 and the conductive part 110 and between the chip 200 and the separation part 140, to isolate the chip 200 from the conductive part 110 and isolate the chip 200 from the separation part 140. It can be understood that the insulator 400 is disposed in each accommodation sub-cavity 111, so that each chip 200 is isolated from the conductive part 110 and the separation part 140. This effectively avoids a short circuit or another circuit problem to ensure a normal function of the chip package assembly 1000. In addition, a plurality of insulators 400 exist, and therefore can limit and secure all of the plurality of chips 200, thereby effectively preventing deviation of the chip 200 in the package substrate 100.

Figure 4:
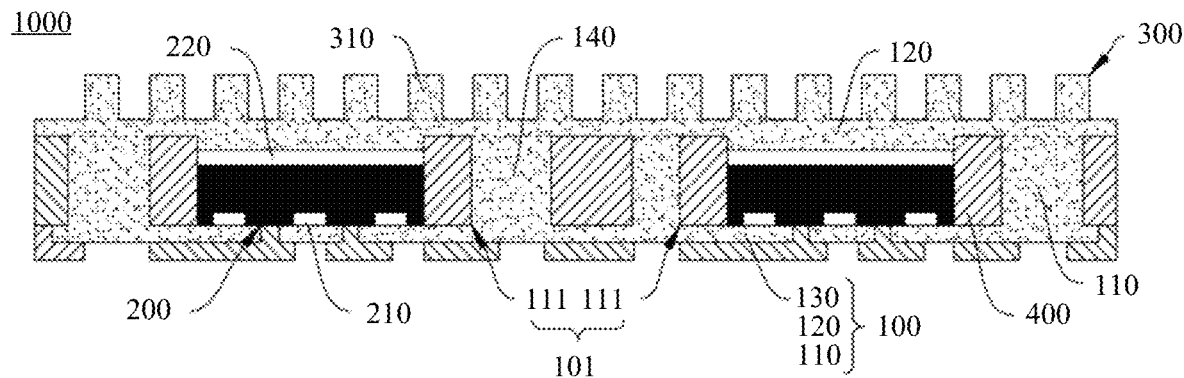
FIG. 4 is a schematic diagram of a structure of a chip package assembly according to an exemplary embodiment.
Figure 5:
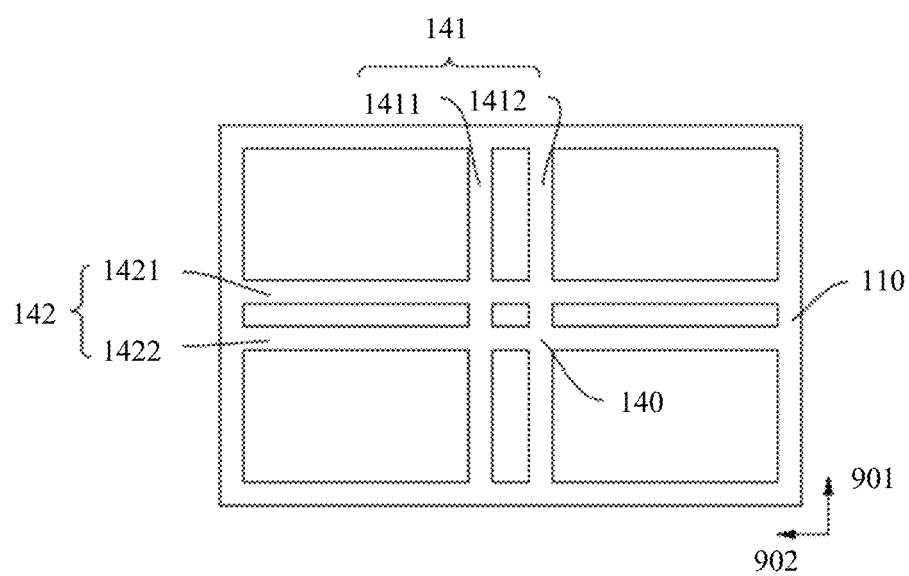
FIG. 5 is a schematic diagram of a top view of a conductive part and a separation part in the chip package assembly shown in FIG. 4.

Refer to both FIG. 4 and FIG. 5. In a possible embodiment, the first separation part 141 includes a first sub-spacer 1411 and a second sub-spacer 1412 that are spaced from each other, and both the first sub-spacer 1411 and the second sub-spacer 1412 extend along the third direction 901; and the second separation part 142 includes a third sub-spacer 1421 and a fourth sub-spacer 1422 that are spaced from each other, and both the third sub-spacer 1421 and the fourth sub-spacer 1422 extend along the fourth direction 902. It can be understood that a plurality of sub-spacers are disposed side by side to form one separation part 140, so that the structural strength of the separation part 140 is greatly improved, thereby effectively improving overall structural stability of the chip package assembly 1000.

Figure 6:
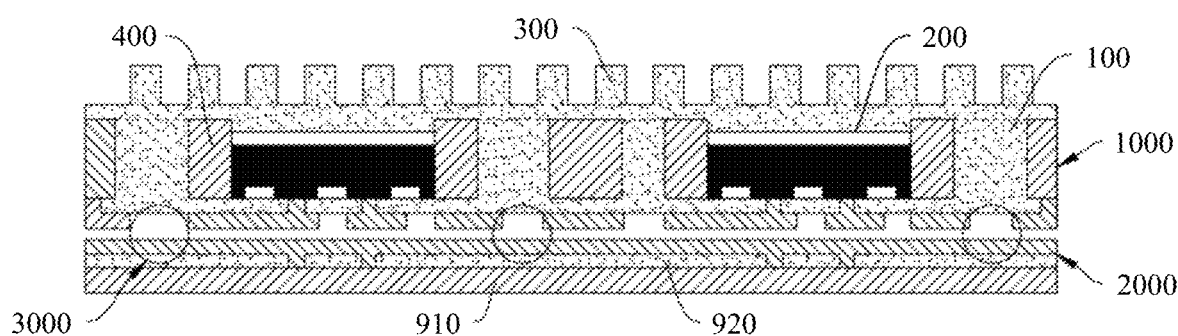
FIG. 6 is a schematic diagram of an assembled structure of a main board and a chip package assembly according to an exemplary embodiment.

An embodiment of this application further provides an electronic device. The electronic device includes a main board 2000 and a chip package assembly 1000 provided in an embodiment of this application. FIG. 6 is a schematic diagram of an assembled structure of the main board 2000 and the chip package assembly 1000. The main board 2000 includes a board body 910 and a line structure 920 disposed on a surface of the board body 910. The chip package assembly 1000 is disposed on a side of the line structure 920 that is away from the board body 910. A connector 3000 is further disposed between the main board 2000 and the chip package assembly 1000. The connector 3000 is connected to a lower conductive layer 130 and the line structure 920, so that the chip package assembly 1000 is electrically connected to the main board 2000. In the electronic device provided in this embodiment of this application, the chip package assembly 1000 is electrically connected to the main board 2000 to meet a corresponding circuit transmission function. In addition, because the chip package assembly 1000 in the foregoing embodiments is used in the electronic device provided in this embodiment of this application, the electronic device also has relatively good heat dissipation performance, moisture-proof performance, and electromagnetic shielding performance, and has relatively strong structural stability. This can effectively avoid structural damage caused by stress action on a chip 200.

In a possible embodiment, a package substrate 100 in the chip package assembly 1000, the main board 2000, and the connector 3000 together surround a chip 200, so that the chip 200 is isolated from the outside. It can be understood that in the foregoing structure, the package substrate 100, the main board 2000, and the connector 3000 together form a complete moisture-proof barrier, to effectively block moisture intrusion, thereby achieving a relatively good moisture-proof effect. It should be noted that there may be a plurality of types of connectors 3000, provided that corresponding electrical conduction and moisture-proof functions can be met. In a specific embodiment, the connector 3000 is solder paste, that is, the lower conductive layer 130 and the line structure 920 are connected by soldering, to implement an electrical connection between the main board 2000 and the chip package assembly 1000.

Figure 7:
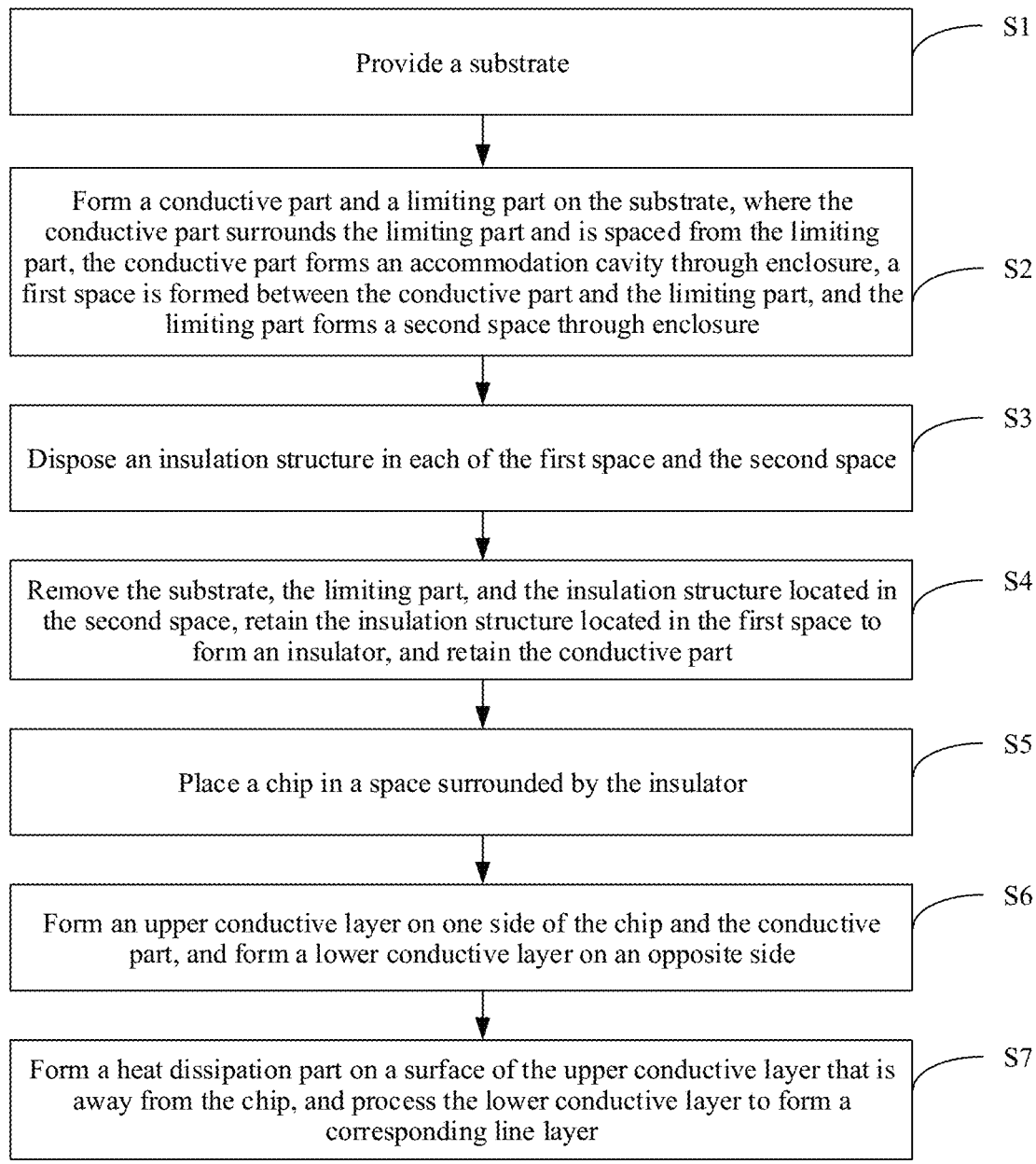
FIG. 7 is a schematic flowchart of a preparation method of a chip package assembly according to an exemplary embodiment of this application.
Figure 8:
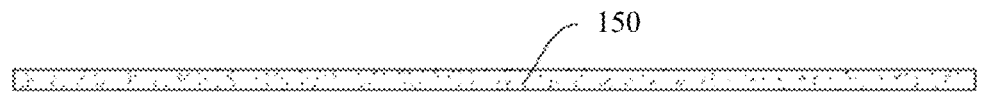
FIG. 8 is a schematic diagram of a structure of a substrate according to an exemplary embodiment.

Referring to FIG. 7, an embodiment of this application further provides a preparation method of a chip package assembly 1000. The preparation method includes the following several steps:

Step S1: Provide a substrate 150. Referring to FIG. 8, it can be understood that the substrate 150 is a flat plate structure, and the substrate 150 is used as a processing carrier. Subsequent parts are all formed on a surface of the substrate 150. Therefore, the substrate 150 may be prepared by using a same material as other parts. In a specific embodiment, a material of the substrate 150 is copper.

Step S2: Form a conductive part 110 and a limiting part 160 on the substrate 150, where the conductive part 110 surrounds the limiting part 160 and is spaced from the limiting part 160, the conductive part 110 encloses an accommodation cavity 101, a first space 102 is formed between the conductive part 110 and the limiting part 160, and the limiting part 160 encloses a second space 103. Materials of the conductive part 110, the limiting part 160, and the substrate 150 may be the same. In a specific embodiment, the materials of the conductive part 110, the limiting part 160, and the substrate 150 are all copper, so that the conductive part 110 and the limiting part 160 may be formed on the surface of the substrate 150 by electroplating. It can be understood that in the foregoing structure, both the first space 102 and the second space 103 are parts of the accommodation cavity 101, and the first space 102 and the second space 103 each are configured to accommodate an insulation structure 410.

Figure 9A:
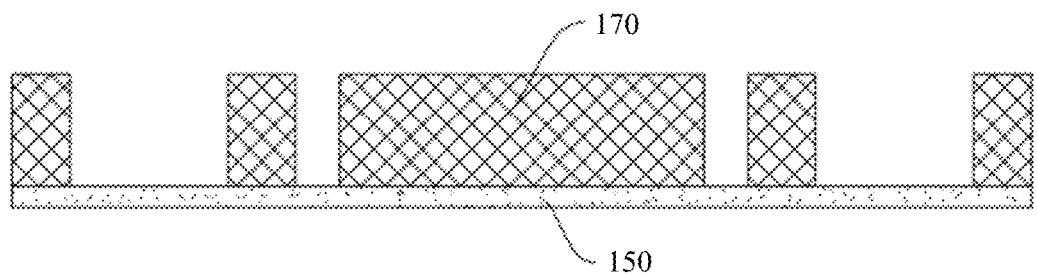
FIG. 9a is a schematic diagram of a structure in which a surface of a substrate is covered with a first dry film according to an exemplary embodiment.
Figure 9B:
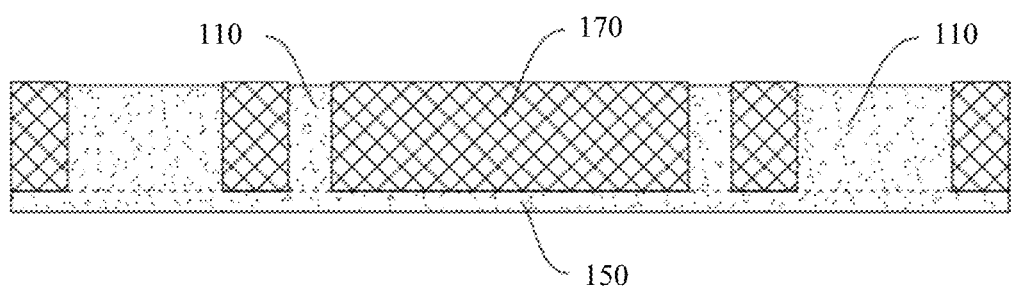
FIG. 9b is a schematic diagram of a structure in which a conductive part and a limiting part are formed at locations not covered with a first dry film according to an exemplary embodiment.
Figure 9C:
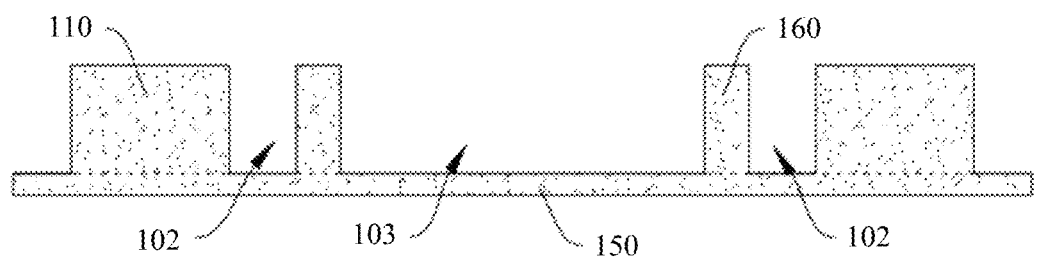
FIG. 9c is a schematic diagram of a combined structure, of a substrate, a conductive part, and a limiting part, that is obtained after a first dry film is removed according to an exemplary embodiment.

Refer to all of FIG. 9a to FIG. 9c. In a possible embodiment, step S2 may specifically include the following several steps:

Step S21: Cover a partial location on a surface of the substrate 150 with a first dry film 170 (as shown in FIG. 9a).

Step S22: Form the conductive part 110 and the limiting part 160 by electroplating at locations not covered with the first dry film 170 (as shown in FIG. 9b).

Step S23: Remove the first dry film 170 (as shown in FIG. 9c).

It can be understood that by dividing regions on the surface of the substrate 150, a location at which the conductive part 110 and the limiting part 160 do not need to be formed is covered with the first dry film 170, and the first dry film 170 can prevent contact between electroplated metal and the substrate 150. The locations at which the conductive part 110 and the limiting part 160 need to be formed are not covered with the first dry film 170, to expose the substrate 150 at the locations, so that the conductive part 110 and the limiting part 160 are formed by electroplating on the surface of the substrate 150 at the locations.

Figure 10A:
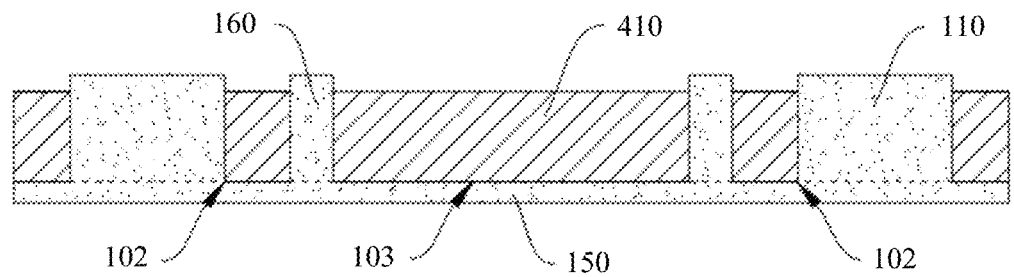
FIG. 10a is a schematic diagram of a structure in which insulation structures are formed in a first space and a second space according to an exemplary embodiment.

Step S3: Dispose the insulation structure 410 in each of the first space 102 and the second space 103. Refer to both FIG. 10a and FIG. 10b. In a possible embodiment, step S3 specifically includes the following several steps:

Step S31: Fill an insulating material in the first space 102 and the second space 103, and perform press-fit processing to form the insulation structures 410 (as shown in FIG. 10a). In a specific embodiment, the insulating material is a resin material, so that the insulation structures 410 can implement a corresponding insulation function. It should be noted that the insulating material may alternatively be any other material having an insulation property. This is not specifically limited herein.

Figure 10B:
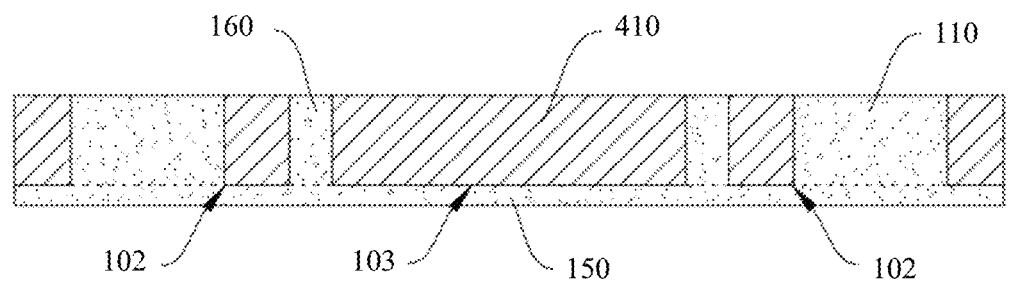
FIG. 10b is a schematic diagram of a combined structure obtained after a conductive part and a limiting part are ground and become flush according to an exemplary embodiment.

Step S32: Planarize the conductive part 110 and the limiting part 160, so that heights of the insulation structures 410, the conductive part 110, and the limiting part 160 are the same in a thickness direction of the substrate 150 (as shown in FIG. 10b). It can be understood that the planarization enables the insulation structures 410, the conductive part 110, and the limiting part 160 to have a same height. In this way, when an upper conductive layer 120 is subsequently formed, a surface to which the upper conductive layer 120 is attached is flatter. This facilitates processing and forming of the upper conductive layer 120.

Figure 11A:
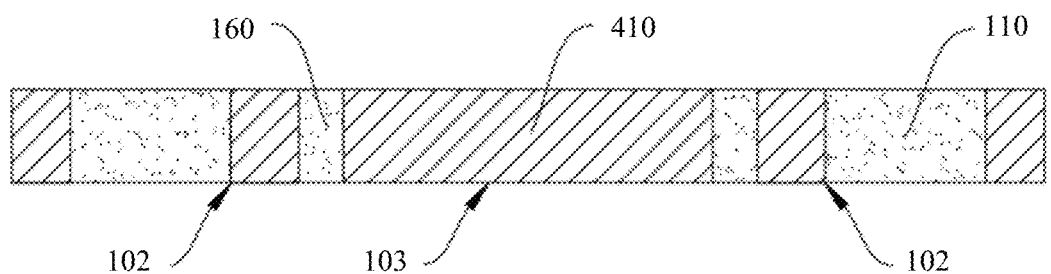
FIG. 11a is a schematic diagram of a combined structure, of an insulation structure, a conductive part, and a limiting part, that is obtained after a substrate is removed according to an exemplary embodiment.

Step S4: Remove the substrate 150, the limiting part 160, and the insulation structure 410 located in the second space 103, retain the insulation structure 410 located in the first space 102 to form an insulator 400, and retain the conductive part 110. It can be understood that the substrate 150 does not exist in a finished product and is an intermediate structure in a preparation process. Therefore, the substrate 150 may be first removed in an etching manner. It can be further understood that, the limiting part 160 does not exist in the finished product, either, and is configured to form the first space 102 together with the conductive part 110, so as to form the insulator 400. Therefore, the limiting part 160 also needs to be removed. Refer to all of FIG. 11a to FIG. 11d. In a possible embodiment, step S4 specifically includes the following several steps:

Step S41: Etch the substrate 150 to remove the substrate 150 (as shown in FIG. 11a).

Figure 11B:
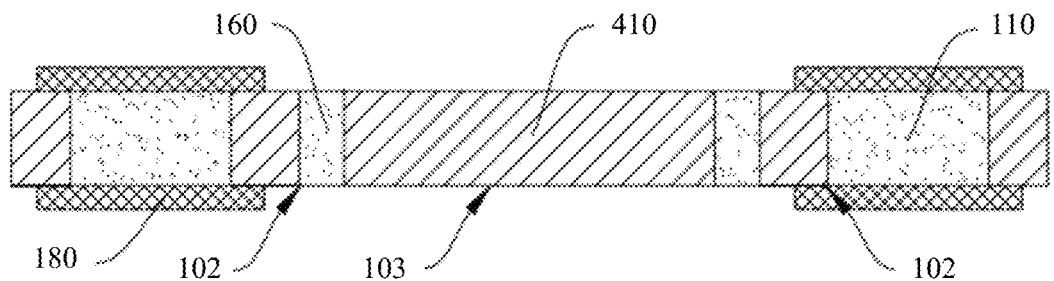
FIG. 11b is a schematic diagram of a structure in which a surface of a conductive part is covered with a second dry film according to an exemplary embodiment.

Step S42: Cover a surface of the conductive part 110 with a second dry film 180 (as shown in FIG. 11b).

Figure 11C:
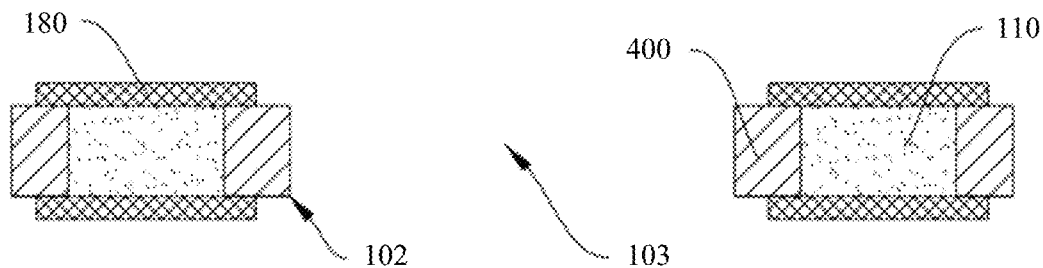
FIG. 11c is a schematic diagram of a combined structure, of a conductive part, an insulator, and a second dry film, that is obtained after etching according to an exemplary embodiment.

Step S43: Etch the limiting part 160 not covered with the second dry film 180, to remove the limiting part 160 and the insulation structure 410 located in the second space 103 (as shown in FIG. 11c).

Figure 11D:
FIG. 11d is a schematic diagram of a combined structure, of a conductive part and an insulator, that is obtained after a second dry film is removed according to an exemplary embodiment.

Step S44: Remove the second dry film 180 (as shown in FIG. 11d).

It can be understood that the second dry film 180 is configured to block erosion from a chemical agent. After the substrate 150 is etched and removed, the surface of the conductive part 110 is covered with the second dry film 180, so that the conductive part 110 can be effectively prevented from being etched, and the conductive part 110 is retained. It can be further understood that, the limiting part 160 not protected by a dry film may also be removed through etching by using a chemical agent. In addition, the insulation structure 410 located in the second space 103 is also removed because the insulation structure 410 is not secured by the limiting part 160 and the substrate 150. The retained insulation structure 410 located in the first space 102 forms the insulator 400, to secure the chip 200 and isolate the chip 200 from the conductive part 110.

Figure 12:
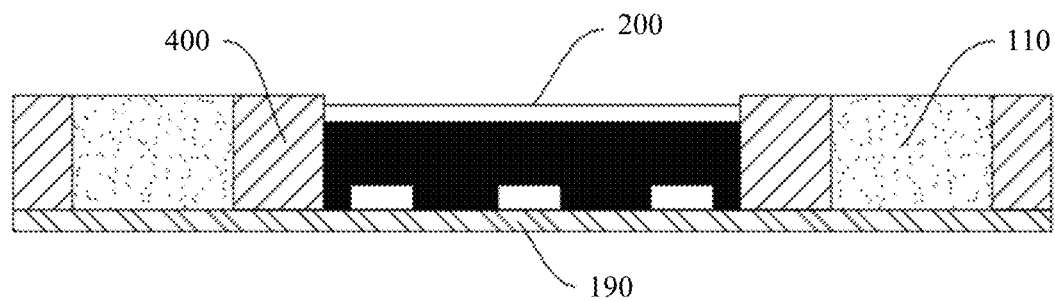
FIG. 12 is a schematic diagram of a combined structure in which a chip is installed in the combined structure shown in FIG. 11d according to an exemplary embodiment.

Step S5: Place the chip 200 in a space surrounded by the insulator 400 (as shown in FIG. 12). In a specific embodiment, the chip 200 may be attached to the accommodation cavity 101 by sticking tape 190. After the chip 200 is mounted, the tape 190 is removed, to perform subsequent processing steps.

Figure 13:
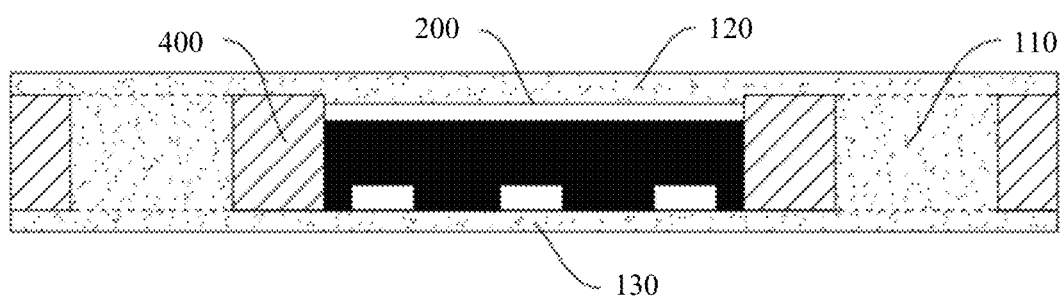
FIG. 13 is a schematic diagram of a combined structure in which an upper conductive layer and a lower conductive layer are formed on the combined structure shown in FIG. 12.

Step S6: Form the upper conductive layer 120 on one side of the chip 200 and the conductive part 110, and form a lower conductive layer 130 on an opposite side (as shown in FIG. 13). It can be understood that the upper conductive layer 120 and the lower conductive layer 130 may be formed in a plurality of manners. This is not specifically limited herein. For example, both the upper conductive layer 120 and the lower conductive layer 130 may be formed by electroplating.

Figure 14:
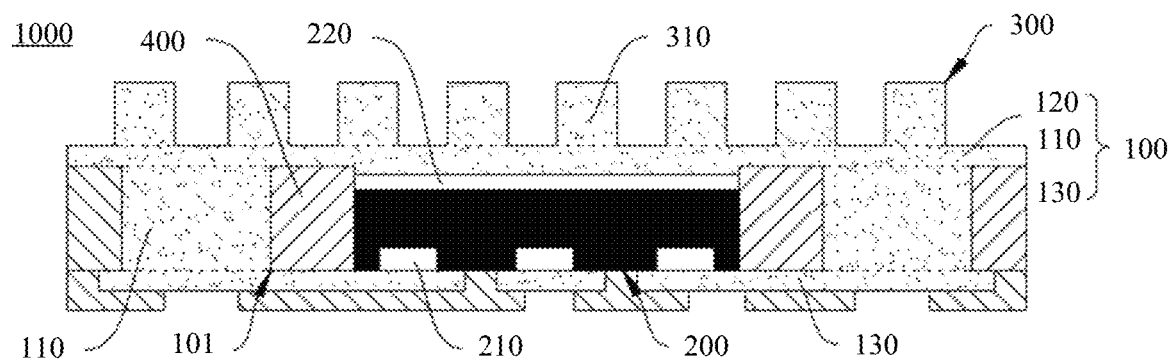
FIG. 14 is a schematic diagram of a structure of a chip package assembly according to an exemplary embodiment.

Step S7: Form a heat dissipation part 300 on a surface of the upper conductive layer 120 that is away from the chip 200, and process the lower conductive layer 130 to form a corresponding line layer (as shown in FIG. 14). It can be understood that the heat dissipation part 300 may be formed on the upper conductive layer 120 by electroplating, to implement a heat dissipation function. The lower conductive layer 130 may be etched in an etching manner to form the corresponding line layer, to implement a circuit transmission function.

Figure 15:
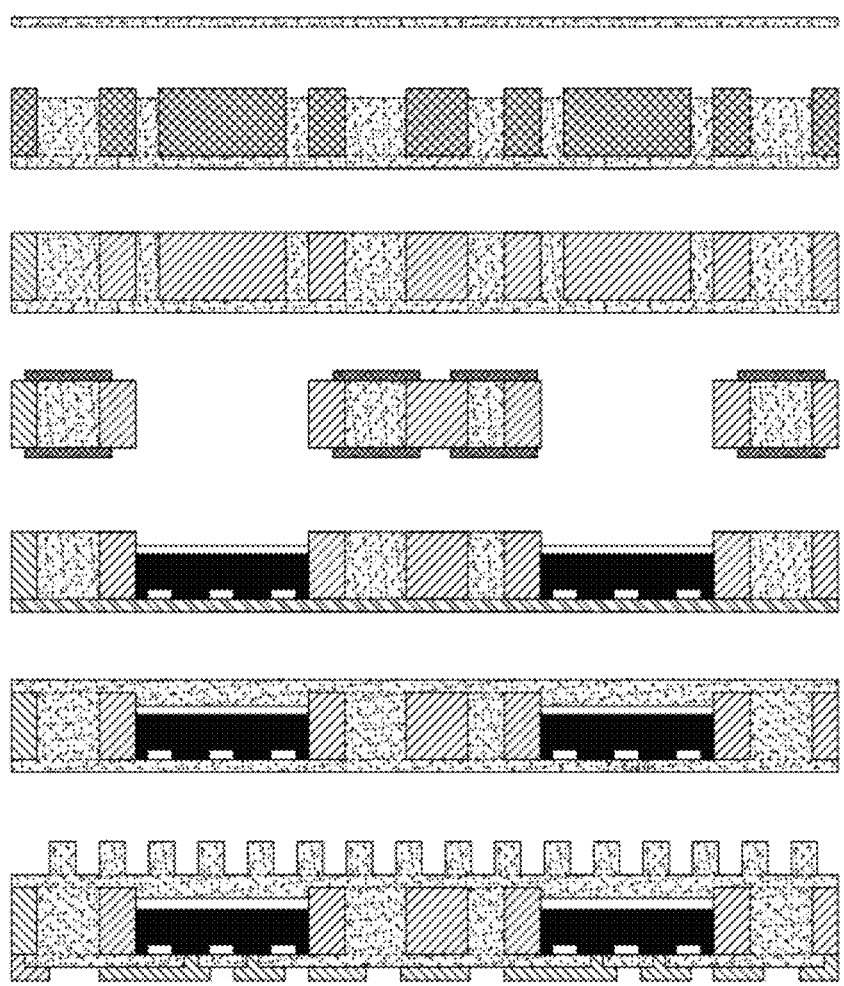
FIG. 15 is a schematic diagram of a structure of each preparation step of a chip package assembly according to another exemplary embodiment.

Referring to FIG. 15, it can be further understood that, when the prepared chip package assembly 1000 needs to package a plurality of chips 200, a separation part 140 needs to be further disposed. Correspondingly, steps of the preparation method provided in this embodiment are changed accordingly. In this embodiment, step S2 further includes: further forming at least one separation part 140 on the substrate 150, where the separation part 140 is connected to the conductive part 110, the separation part 140 divides the accommodation cavity 101 into a plurality of accommodation sub-cavities 111, the limiting part 160 is disposed in the accommodation sub-cavity 111 and is spaced from the conductive part 110 and the separation part 140, the first space 102 is formed among the limiting part 160, the conductive part 110, and the separation part 140, and the limiting part 160 encloses the second space 103. Step S4 further includes: retaining the separation part 140. Other steps are substantially the same as those in the foregoing embodiments, and details are not described herein.

According to the preparation method of the chip package assembly 1000 provided in this embodiment of this application, the chip package assembly 1000 provided in this embodiment of this application can be prepared. In addition, the chip package assembly 1000 has relatively good heat dissipation performance, moisture-proof performance, and electromagnetic shielding performance, and has relatively strong structural stability. This can effectively avoid structural damage caused by stress acting on the chip 200.

The foregoing descriptions are merely specific implementations of this application, but are not intended to limit the protection scope of this application. Any variation or replacement readily figured out by a person skilled in the art within the technical scope disclosed in this application shall fall within the protection scope of this application. When no conflict occurs, embodiments of this application and the features in the embodiments may be mutually combined. Therefore, the protection scope of this application shall be subject to the protection scope of the claims.

What is claimed is:

1. A chip package assembly, comprising:
   a package substrate comprising an upper thermally conductive layer, a lower thermally conductive layer, and a thermally conductive part connected between the upper thermally conductive layer and the lower thermally conductive layer;
   a chip comprising a front electrode and a back electrode disposed opposite to each other, wherein the chip is embedded in the package substrate, the thermally conductive part surrounds the chip, the front electrode is connected to the lower thermally conductive layer, and the back electrode is connected to the upper thermally conductive layer; and
   a heat dissipation part connected to a surface of the upper thermally conductive layer that is away from the chip, wherein
   the heat dissipation part comprises a plurality of heat dissipation protuberances, each of the plurality of heat dissipation protuberances are connected to the upper conductive layer, and the plurality of heat dissipation protuberances are spaced from each other, and
   wherein an extension direction of some heat dissipation protuberances is a first direction, an extension direction of some other heat dissipation protuberances is a second direction, and the first direction is different from the second direction.

2. The chip package assembly according to claim 1, wherein an extension direction of each heat dissipation protuberance and an extension direction of the upper conductive layer are arranged at an included angle.

3. The chip package assembly according to claim 2, wherein the heat dissipation protuberances are flat plate-shaped or columnar.

4. The chip package assembly according to claim 1, wherein the heat dissipation part and the upper thermally conductive layer are an integrated structure.

5. The chip package assembly according to claim 4, wherein the thermally conductive part, the upper thermally conductive layer, and the lower thermally conductive layer each comprise a metal.

6. The chip package assembly according to claim 1, wherein the thermally conductive part, the upper thermally conductive layer, and the lower thermally conductive layer together form an integrated structure.

7. A chip package assembly, comprising:
   a package substrate comprising an upper thermally conductive layer, a lower thermally conductive layer, and a thermally conductive part connected between the upper thermally conductive layer and the lower thermally conductive layer;
   a chip comprising a front electrode and a back electrode disposed opposite to each other, wherein the chip is embedded in the package substrate, the thermally conductive part surrounds the chip, the front electrode is connected to the lower thermally conductive layer, and the back electrode is connected to the upper thermally conductive layer; and
   a heat dissipation part connected to a surface of the upper thermally conductive layer that is away from the chip, wherein the chip package assembly further comprises an insulator disposed between the chip and the conductive part to isolate the chip from the conductive part.

8. The chip package assembly according to claim 7, wherein the insulator is disposed between the chip and the conductive part, and disposed between the chip and the separation part, to isolate the chip from the conductive part and isolate the chip from the separation part.

9. The chip package assembly according to claim 7, wherein the at least one separation part comprises a first separation part and a second separation part, the first separation part extends along a third direction, and the second separation part extends along a fourth direction; and
   both the third direction and the fourth direction are perpendicular to a thickness direction of the chip package assembly, and the third direction and the fourth direction are arranged at an included angle.

10. The chip package assembly according to claim 9, wherein the first separation part comprises a first sub-spacer and a second sub-spacer that are spaced from each other, and both the first sub-spacer and the second sub-spacer extend along the third direction; and
    the second separation part comprises a third sub-spacer and a fourth sub-spacer that are spaced from each other, and both the third sub-spacer and the fourth sub-spacer extend along the fourth direction.

11. The chip package assembly according to claim 7, wherein the heat dissipation part comprises a plurality of heat dissipation protuberances, each of the plurality of heat dissipation protuberances are connected to the upper conductive layer, and the plurality of heat dissipation protuberances are spaced from each other, wherein an extension direction of some heat dissipation protuberances is a first direction, an extension direction of some other heat dissipation protuberances is a second direction, and the first direction is different from the second direction.

12. The chip package assembly according to claim 7, wherein the heat dissipation part and the upper conductive layer are an integrated structure.

13. The chip package assembly according to claim 7, wherein the thermally conductive part, the upper thermally conductive layer, and the lower thermally conductive layer together form an integrated structure.

14. An electronic device, comprising:
a main board and a chip package assembly, the chip package assembly comprising:
a package substrate comprising an upper thermally conductive layer, a lower thermally conductive layer, and a thermally conductive part connected between the upper thermally conductive layer and the lower thermally conductive layer;
a chip comprising a front electrode and a back electrode that are disposed opposite to each other, wherein the chip is embedded in the package substrate, the thermally conductive part surrounds the chip, the front electrode is connected to the lower thermally conductive layer, and the back electrode is connected to the upper thermally conductive layer; and
a heat dissipation part connected to a surface of the upper thermally conductive layer that is away from the chip, wherein
the main board comprises a board body and a line structure disposed on a surface of the board body, the chip package assembly is disposed on a side of the line structure that is away from the board body, a connector is further disposed between the main board and the chip package assembly, and the connector is connected to the lower thermally conductive layer and the line structure, so that the chip package assembly is electrically connected to the main board.

15. The electronic device according to claim 14, wherein a package substrate in the chip package assembly, the main board, and the connector together surround the chip, so that the chip is isolated from the outside.

16. The electronic device according to claim 14 wherein the heat dissipation part comprises a plurality of heat dissipation protuberances, each of the plurality of heat dissipation protuberances are connected to the upper thermally conductive layer, and the plurality of heat dissipation protuberances are spaced from each other.

17. The electronic device according to claim 14 wherein the heat dissipation part and the upper thermally conductive layer are an integrated structure.

* * * * *

UNITED STATES PATENT AND TRADEMARK OFFICE
CERTIFICATE OF CORRECTION

PATENT NO. : 12,354,967 B2
APPLICATION NO. : 17/872473
DATED : July 8, 2025
INVENTOR(S) : Zhaozheng Hou et al.

Page 1 of 1

It is certified that error appears in the above-identified patent and that said Letters Patent is hereby corrected as shown below:

In the Claims

In Column 20, Claim 16, Line 11, delete "claim 14" and insert -- claim 14, --, therefor.

In Column 20, Claim 17, Line 17, delete "claim 14" and insert -- claim 14, --, therefor.

Signed and Sealed this
Twenty-third Day of December, 2025

John A. Squires
*Director of the United States Patent and Trademark Office*